United States Patent
Koontz et al.

(10) Patent No.: US 11,231,239 B2
(45) Date of Patent: Jan. 25, 2022

(54) THREADED COOLING APPARATUS WITH INTEGRATED COOLING CHANNELS AND HEAT EXCHANGER

(71) Applicant: Raytheon Company, Waltham, MA (US)

(72) Inventors: Christopher R. Koontz, Manhattan Beach, CA (US); Scott T. Johnson, Torrance, CA (US); Shadi S. Merhi, Fullerton, CA (US)

(73) Assignee: Raytheon Company, Waltham, MA (US)

( * ) Notice: Subject to any disclaimer, the term of this patent is extended or adjusted under 35 U.S.C. 154(b) by 171 days.

(21) Appl. No.: 16/589,840

(22) Filed: Oct. 1, 2019

(65) Prior Publication Data
US 2020/0049429 A1    Feb. 13, 2020

Related U.S. Application Data

(62) Division of application No. 13/691,259, filed on Nov. 30, 2012, now abandoned.

(51) Int. Cl.
| | |
|---|---|
| *F28F 7/02* | (2006.01) |
| *H01L 23/40* | (2006.01) |
| *H01L 23/473* | (2006.01) |
| *F28D 21/00* | (2006.01) |

(52) U.S. Cl.
CPC ............ *F28F 7/02* (2013.01); *H01L 23/4006* (2013.01); *H01L 23/473* (2013.01); *F28D 2021/0029* (2013.01); *F28F 2275/20* (2013.01); *H01L 2023/4062* (2013.01); *H01L 2924/0002* (2013.01)

(58) Field of Classification Search
CPC . F28D 2021/0029; F28F 7/02; F28F 2275/20; H01L 23/4006; H01L 23/473; H01L 2023/4062; H01L 2924/0002; H05K 7/20254; H05K 7/20272; H05K 7/20309; H05K 7/20327
See application file for complete search history.

(56) References Cited

U.S. PATENT DOCUMENTS

| | | | |
|---|---|---|---|
| 3,743,011 A | 7/1973 | Frost | |
| 3,908,188 A * | 9/1975 | Kawamoto | H01L 23/4735 257/664 |
| 4,131,785 A | 12/1978 | Shutt | |
| 4,227,102 A | 10/1980 | Rozenfeld et al. | |
| 4,494,171 A | 1/1985 | Bland et al. | |

(Continued)

*Primary Examiner* — Eric S Ruppert
*Assistant Examiner* — Hans R Weiland (57) ABSTRACT

A threaded cooling apparatus includes a head having a heat exchanger and a shaft having a threaded section configured to mechanically fasten the head to a structure. The heat exchanger is configured to exchange heat with a coolant flowing through the head. The shaft also includes first and second cooling channels. The first cooling channel is configured to deliver the coolant to the heat exchanger, and the second cooling channel is configured to exhaust the coolant from the heat exchanger. The apparatus may also include a first seal between the head and the structure that is configured to reduce or prevent coolant loss. The apparatus may further include a second seal that is configured to reduce or prevent coolant flow between the first and second cooling channels that bypasses the heat exchanger.

20 Claims, 8 Drawing Sheets

(56) References Cited

U.S. PATENT DOCUMENTS

| | | | |
|---|---|---|---|
| 4,580,625 | A | 4/1986 | Yamanaka et al. |
| 4,638,854 | A | 1/1987 | Noren |
| 4,696,339 | A | 9/1987 | Schwarz |
| 4,882,654 | A * | 11/1989 | Nelson .................. H01L 23/433 |
| | | | 361/701 |
| 4,909,315 | A | 3/1990 | Nelson et al. |
| 4,977,444 | A | 12/1990 | Nakajima et al. |
| 5,263,536 | A * | 11/1993 | Hulburd .............. H01S 5/02423 |
| | | | 165/104.33 |
| 6,549,407 | B1 | 4/2003 | Sauciuc et al. |
| 6,778,393 | B2 | 8/2004 | Messina et al. |
| 6,892,801 | B1 | 5/2005 | Kim |
| 2009/0272512 | A1 | 11/2009 | Huang |
| 2011/0232864 | A1 | 9/2011 | Zaffetti |

\* cited by examiner

THREADED COOLING APPARATUS WITH INTEGRATED COOLING CHANNELS AND HEAT EXCHANGER

CROSS-REFERENCE TO RELATED APPLICATION AND PRIORITY CLAIM

This application is a divisional of U.S. patent application Ser. No. 13/691,259 filed on Nov. 30, 2012, which is hereby incorporated by reference in its entirety.

GOVERNMENT LICENSE RIGHTS

This invention was made with U.S. government support under Contract No. FA8650-04-G-0002-0001 awarded by the U.S. Department of Defense. The U.S. government may have certain rights in the invention.

TECHNICAL FIELD

This disclosure is generally directed to cooling systems. More specifically, this disclosure relates to a threaded cooling apparatus with integrated cooling channels and heat exchanger.

BACKGROUND

Electronic devices routinely require mechanisms for rejecting or transferring heat away from electronic components. Many electronic devices are designed to reject heat through the tops of their packaging. Due to mechanical assembly tolerances and design differences, however, different components often have surfaces that vary with respect to one another and from device to device. Any cooling system designed to mate to the top surfaces of an array of components often needs to accommodate vertical height variations among those components.

Different cooling systems have used various approaches to transfer heat away from electronic components, but these approaches have various shortcomings. A first approach includes mounting electronic components directly on a flat heat exchanger. However, it is typically impractical to mount all components on a single heat exchanger. Also, a flat heat exchanger covering multiple heat sources is typically a monolithic assembly of a single material, where a heat exchanger element is not separable from the larger assembly. As a result, if one heat exchanger element becomes fouled or clogged, the whole assembly often must be replaced. Additionally, if a particular material is required in the heat exchanger element for efficient heat exchange, the complete assembly often needs to be manufactured with the same material, which can result in greater cost, greater weight, and lower overall heat exchange efficiency.

A second approach involves mounting a heat exchanger on an electronic component and plumbing the heat exchanger with flexible coolant lines. However, mounting multiple heat exchangers on multiple components typically requires many fluidic couplings, which often is impractical for assembly and is susceptible to leaks. Moreover, fluidic couplings are often different mechanisms from mechanical fasteners that provide mechanical coupling of a heat exchanger to a larger assembly. The design and installation complexity of heat exchanger elements increases proportionally with the number of mechanical and fluid interconnects. A third approach includes conducting heat away from electronic components through a conforming thermal interface material, but these materials often experience very large temperature gradients. A fourth approach involves deflecting flexible cooling elements to engage electronic components, but flexible cooling elements often require large amounts of space, thereby limiting the pitch or density of the electronic components.

SUMMARY

This disclosure provides a threaded cooling apparatus with integrated cooling channels and heat exchanger.

In a first embodiment, a threaded cooling apparatus includes a head having a heat exchanger and a shaft having a threaded section configured to mechanically fasten the head to a structure. The heat exchanger is configured to exchange heat with a coolant flowing through the head. The shaft also includes first and second cooling channels. The first cooling channel is configured to deliver the coolant to the heat exchanger, and the second cooling channel is configured to exhaust the coolant from the heat exchanger.

In a second embodiment, a system includes a threaded cooling apparatus and a manifold. The threaded cooling apparatus includes a head having a heat exchanger and a shaft having a threaded section. The heat exchanger is configured to exchange heat with a coolant flowing through the head. The shaft also includes first and second cooling channels, where the first cooling channel is configured to deliver the coolant to the heat exchanger and the second cooling channel is configured to exhaust the coolant from the heat exchanger. The manifold includes first and second coolant channels. The first coolant channel is configured to provide the coolant to the first cooling channel of the threaded cooling apparatus, and the second coolant channel is configured to return the coolant from the second cooling channel of the threaded cooling apparatus. The threaded section is configured to mechanically fasten the head to the manifold.

In a third embodiment, a method includes inserting a threaded cooling apparatus into a structure, where the threaded cooling apparatus includes a head and a shaft. The head includes a heat exchanger, and the shaft includes a threaded section configured to mechanically fasten the head to the structure. The method also includes providing coolant to the heat exchanger through a first cooling channel in the shaft, where the heat exchanger is configured to exchange heat with the coolant flowing through the head. The method further includes exhausting the coolant from the heat exchanger through a second cooling channel in the shaft.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 8, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1A:
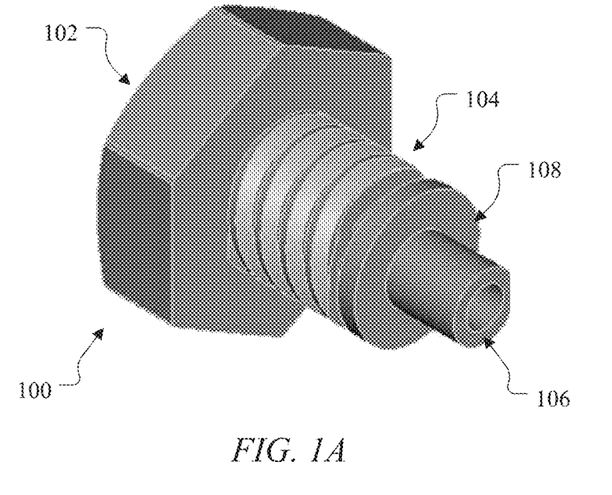
FIGS. 1A and 1B illustrate a first example threaded cooling apparatus with integrated cooling channels and heat exchanger in accordance with this disclosure.
Figure 1B:
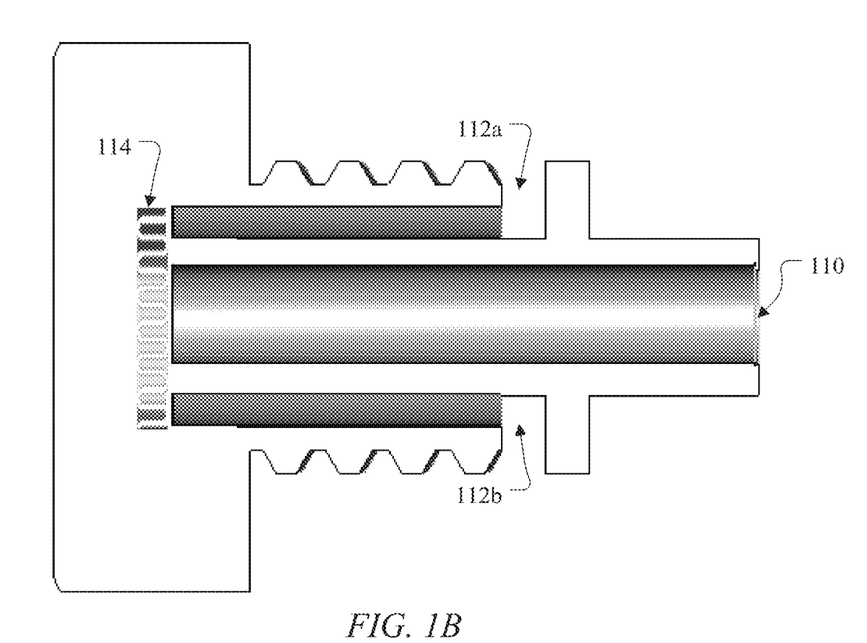

FIGS. 1A and 1B illustrate a first example threaded cooling apparatus 100 with integrated cooling channels and heat exchanger in accordance with this disclosure. As shown in FIG. 1A, the apparatus 100 has the form of a bolt with a head 102 and a threaded section 104. The head 102 generally represents any suitable structure that can be turned to screw/unscrew the threaded section 104 into another structure. In this example, the head 102 represents a hexagonal bolt head. However, the head 102 could represent any other suitable structure that is capable of containing a heat exchanger (described below). The head 102 could also support other mechanisms for turning the apparatus 100, such as a screw head. The head 102 could be formed from any suitable material(s) and in any suitable manner, and the method of manufacturing can affect the materials used (or vice versa).

The threaded section 104 represents a portion of the apparatus 100 that includes a thread wrapped helically around a central shaft 106, which is connected to the head 102. The threaded section 104 helps to couple the apparatus 100 to a larger device or system, such as by engaging a threaded receptacle in the larger device or system. The threaded section 104 could include a thread having any suitable thread size and threads per inch. The threaded section 104 could be formed from any suitable material(s) and in any suitable manner. The threaded section 104 may or may not be formed from the same material(s) as the head 102. Also, while shown as having a cylindrical cross-section, the shaft 106 of the apparatus 100 could have any other suitable cross-sectional shape.

In this example, the threaded section 104 extends along the shaft 106 from the head 102 of the apparatus 100 down to a flow restrictor 108. The flow restrictor 108 represents a circular or other structure around the shaft 106. As described below, the flow restrictor 108 helps to restrict bypass flow of coolant between cooling channels in the apparatus 100.

As shown in FIG. 1B, the apparatus 100 includes multiple cooling channels through at least a portion of the shaft 106. A cooling channel 110 is formed through the shaft 106 of the apparatus 100, and cooling channels 112a-112b are formed through or near the threaded section 104 of the apparatus 100. The cooling channels 110, 112a-112b support the flow of coolant (such as a liquid or gas) to and from a heat exchanger 114 within the head 102 of the apparatus 100. In some embodiments, the cooling channel 110 provides coolant to the heat exchanger 114, and the cooling channels 112a-112b exhaust returned coolant that has interacted with the heat exchanger 114. Coolant flow could also be reversed depending on the implementation.

Each cooling channel 110, 112a-112b represents any suitable path for coolant through at least part of the shaft 106 of the apparatus 100. In this example, the cooling channel 110 extends the entire length of the shaft 106 from the location where the head 102 joins the shaft 106 to the bottom of the shaft 106. Also, each cooling channel 112a-112b here is shown as residing between the threaded section 104 and the central shaft 106 of the apparatus 100. However, the cooling channels 112a-112b could be formed in other ways. For instance, the cooling channels 112a-112b could be formed as grooves or other paths through the threaded section 104, so the thread in the threaded section 104 is not continuous but is instead divided in locations where the cooling channels 112a-112b are present.

Each of the cooling channels 110, 112a-112b could also be formed in any suitable manner. For example, the cooling channel 110 could be formed by drilling or otherwise forming an opening through the shaft 106 of the apparatus 100. The cooling channels 112a-112b could be formed by machining or otherwise forming a path through or under the threaded section 104 of the apparatus 100.

The heat exchanger 114 could include any suitable heat exchanging elements. For example, the heat exchanger 114 could contain extended surfaces (fins), such as straight, wavy, or offset fins. The fins could be stamped, perforated, or machined. A porous medium could be used in the heat exchanger 114 without fins. The heat exchanger 114 could include straight or radial channels. The heat exchanger 114 could have multiple levels of coolant plumbing, such as a lower chamber and an upper chamber separated by small openings to supply and return coolant from one chamber to the other. The heat exchanger 114 could support jet impingement cooling, single-phase cooling, or multi-phase cooling. The heat exchanger 114 could contain a phase-change material (such as paraffin) that remains within the heat exchanger 114, while coolant could run through another portion of the heat exchanger 114. Any combination of these or other features could also be used in the heat exchanger 114.

The heat exchanger 114 and the apparatus 100 in general could be formed from any suitable material(s). Example materials include aluminum or an aluminum alloy (such as 6061-T6), titanium, copper, a copper-based matrix composite (such as GLIDCOP), a nickel-iron alloy (such as INVAR), steel, or stainless steel.

In addition, the apparatus 100 could be formed in any suitable manner. Example techniques include brazing, welding (such as friction welding), diffusion bonding, soldering, polymeric bonding, additive manufacturing, machining, and stamping. The heat exchanger 114 and the shaft 106 may be fabricated from the same piece of material or as separate pieces. If separate pieces are used, the pieces may be mechanically coupled, such as by using any of the processes above or by threading one end of the shaft 106 into a receptacle in the heat exchanger 114.

As a particular manufacturing example, the head 102 of a fabricated bolt can be machined to form a cavity for the heat exchanger 114, and channels in the shaft 106 of the bolt can be machined to form the cooling channels. Machining can be performed to create connections between the bolt head and the shaft's channels, a fin core can be placed into the cavity in the bolt head 102, and a cap can be brazed onto the bolt head 102.

As another particular manufacturing example, thin foils of metal (such as those about 0.004 inches thick) could be etched with a desired pattern, and the foils can be joined using diffusion bonding. Wire electrical discharge machining (EDM) or other machining can be used to create a part with no external features, and machining can occur to create external features like helical grooves and coolant channels.

As a third particular manufacturing example, additive manufacturing (also known as "3D printing") can be used to create the main structure, and helical grooves in the shaft can be created during the additive manufacturing process or after the additive manufacturing process is complete (such as by machining the resulting structure).

As a fourth particular manufacturing example, a heat exchanger 114 can be fabricated in the head 102 having a single supply/return coolant receptacle with helical grooves. A threaded shaft 106 can be fabricated with helical grooves to mate with the head 102 on one end and helical grooves to mate with another structure on the opposite end. The threaded shaft 106 can be inserted into the head 102.

In this way, the apparatus 100 integrates a threaded shaft having coolant channels with a high-performance cooling mechanism to create a modularized heat exchanger with all mechanical and fluidic connections combined into a single device. The modularized heat exchanger can be easily installed in a larger device or system using a single threaded connection, possibly creating an array of heat exchanger elements, and each modularized heat exchanger can be easily replaced by simply exchanging one threaded apparatus with another threaded apparatus (not necessarily with the same size of heat exchanger). Among other things, this can help to reduce repair costs associated with the apparatus 100 or the larger device/system. The apparatus 100 also provides cooling capabilities in a small package by integrating a heat exchanger and coolant supply/return lines in a single assembly. Moreover, as described below, because the apparatus 100 is threaded, the apparatus 100 is height adjustable, which can help to reduce or eliminate tolerance issues when component heights vary and can provide a fine pitch-scalable solution. Further, the apparatus 100 can be used to help reduce hardware temperatures with a "conforming" heat exchanger element that translates perpendicular to the surface of a coolant manifold. Beyond that, the apparatus 100 allows the heat exchanger to be placed in close proximity to a heat source to be cooled, reducing parasitic temperature rises. In addition, the apparatus 100 can be manufactured in a wide variety of sizes to accommodate various devices to be cooled, such as semiconductor elements of various sizes and packaging densities.

The apparatus 100 could also be used in a wide range of applications. For example, the apparatus 100 may be used to reject heat from a heat source into a coolant or to reject heat from the coolant into a heat sink. Example applications include automotive, aerospace, and electronics cooling. As particular examples, the apparatus 100 could be used to reject heat from a single semiconductor element or an array of semiconductor elements in an electronic assembly. For instance, the apparatus 100 could be inserted into a coolant manifold, and the head 102 of the apparatus 100 could be placed on or near one or more semiconductor elements. Heat from the semiconductor elements is transferred to the coolant flowing through the cooling channels 110, 112a-112b via the heat exchanger 114. The apparatus 100 could also be used in coolant or hydraulic lines where miniature non-integral heat exchanger elements are needed or to reject heat from the hydraulic fluid. Other example uses can include rejecting heat from laser diodes, power transformers, power electronics, combustion chambers or assemblies with combustion chambers (such as automotive combustion engines, turbines, or rocket engines), or any other application where one would wish to transfer heat into or out of a coolant. The apparatus 100 could further be used in installations where clogging, fouling, or corrosion of a heat exchanger is frequent, necessitating frequent replacement of the heat exchanger. In addition, the apparatus 100 could be used in applications where composite/polymer manifold structures are used. Note that the apparatus 100 need not be used as a mechanical fastener, meaning it is not used to mechanically couple components in a secure manner. As a result, the apparatus 100 need not have the same strength or be capable of handling the same torque as conventional bolts (although it could depending on the design, composition, and manufacture).

Although FIGS. 1A and 1B illustrate a first example of a threaded cooling apparatus 100 with integrated cooling channels and heat exchanger, various changes may be made to FIGS. 1A and 1B. For example, the apparatus 100 is shown here as having the form of a bolt. However, the apparatus 100 could be implemented using any other suitable fastener, and the overall apparatus may or may not resemble a standard type of fastener (such as when the head 102 does not fit within a socket wrench). Also, any number of cooling channels within the apparatus 100 could be used to supply coolant to the heat exchanger 114, and any number of cooling channels within the apparatus 100 could be used to exhaust returned coolant from the heat exchanger 114.

Figure 2A:
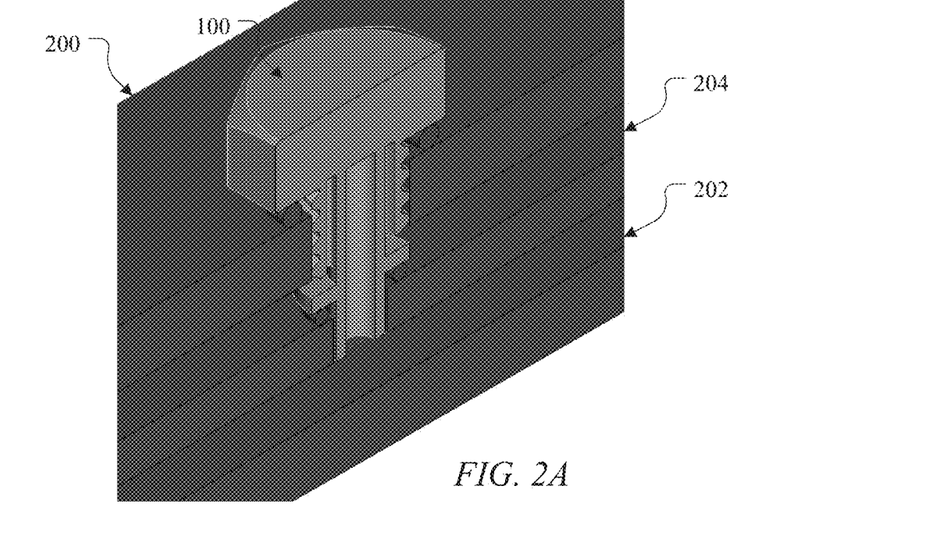
FIGS. 2A and 2B illustrate an example mechanical and fluid coupling of the threaded cooling apparatus of FIGS. 1A and 1B in accordance with this disclosure.
Figure 2B:
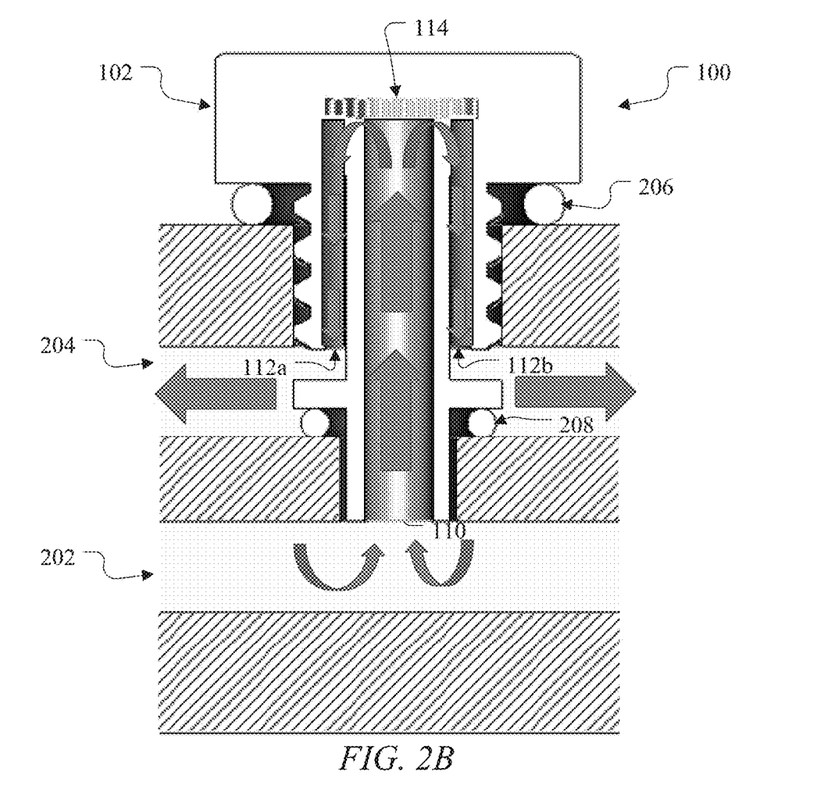

FIGS. 2A and 2B illustrate an example mechanical and fluid coupling of the threaded cooling apparatus 100 of FIGS. 1A and 1B in accordance with this disclosure. As shown in FIG. 2A, the apparatus 100 has been inserted into a manifold 200 having multiple coolant channels 202 and 204. The manifold 200 represents any suitable structure that delivers coolant to and returns coolant from a threaded cooling apparatus. For example, the manifold 200 could represent a portion of a coldplate, and one or multiple threaded cooling apparatuses 100 could be inserted into the coldplate. The manifold 200 could be formed from any suitable material(s) and in any suitable manner.

As shown in FIG. 2B, the coolant channel 202 in the manifold 200 can deliver coolant to the apparatus 100, and the coolant flows into the apparatus 100 through the cooling channel 110. The coolant reaches the heat exchanger 114 in the head 102 of the apparatus 100, which exchanges heat with the coolant. The coolant then flows through the cooling channels 112a-112b to the coolant channel 204 in the manifold 200. As noted above, however, the flow of coolant could be reversed.

As shown in FIGS. 2A and 2B, seals 206 and 208 help limit coolant flow around or out of the apparatus 100. In this example, the seal 206 helps to reduce or prevent coolant from flowing around the apparatus 100 and out of the manifold 200 into the ambient environment. In contrast, the seal 208 helps to reduce or prevent coolant flow between the channels 202 and 204 in the manifold 200 that bypasses the heat exchanger 114. The flow restrictor 108 can similarly help to reduce or prevent coolant flow between the channels 202 and 204 in the manifold 200 that bypasses the heat exchanger 114. For example, the flow restrictor 108 can apply compressive pressure on the seal 208 to improve sealing. The seals 206 and 208 may be replaceable and available in different sizes to accommodate different height adjustments of apparatus 100.

Each seal 206 and 208 represents any suitable structure for helping to reduce or prevent coolant flow in specified areas, such as rubber or other O-rings. In some embodiments, the seal 206 can withstand larger pressure differentials than the seal 208. In particular embodiments, the seal 206 can withstand pressure differentials of about 50 pounds per square inch (psi) or more, while the seal 208 can withstand pressure differentials of about 10 pounds psi or less. Once again, as noted above, the apparatus 100 need not be used as a mechanical fastener, so the apparatus 100 need not have the same strength or be capable of handling the same torque as conventional bolts (although it could).

Note that in this example, the seals 206 and 208 are compressible. As a result, the apparatus 100 can be raised or lowered by small amounts within the manifold 200 while still allowing the seals 206 and 208 to reduce or prevent coolant leakage. This allows the apparatus 100 to vary in height relative to the surface of the manifold 200 (or other surface into which the apparatus 100 is inserted). In particular embodiments, the height of the apparatus 100 could vary by a distance of about ±0.01 inches (±0.254 mm), although the precision of this value could vary depending on the pitch of the threads in the threaded section 104. When multiple apparatuses 100 are inserted into the same structure like a coldplate, the height of each apparatus 100 could vary independently from the others, which allows the apparatuses 100 to conform to the heights of various heat sources (such as semiconductor chips). This also helps to reduce or eliminate the need for using thermal gap filler pads to absorb mechanical tolerances, which can be beneficial since gap filler pads typically have poor thermal performance. This further helps to avoid the use of materials that experience large temperature gradients and can increase the pitch or density of cooled components since flexible manifolds are not needed (although these could still be used with the apparatus 100). Furthermore, the seals 206 and 208 can be replaceable, and the thickness and the material of each seal can be customizable.

Although FIGS. 2A and 2B illustrate one example mechanical and fluid coupling of the threaded cooling apparatus 100 of FIGS. 1A and 1B, various changes may be made to FIGS. 2A and 2B. For example, as noted above, the apparatus 100 could include a single cooling channel 112a or 112b for exhausting returned coolant from the heat exchanger 114. Also, the apparatus 100 could be used in any other suitable structure.

Figure 3A:
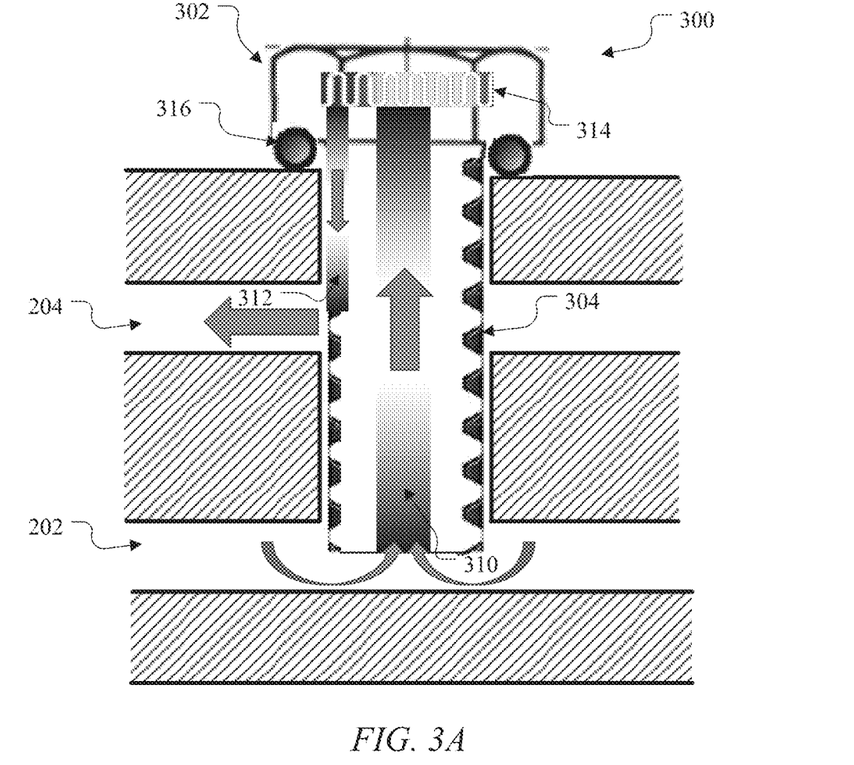
FIGS. 3A and 3B illustrate a second example threaded cooling apparatus with integrated cooling channels and heat exchanger in accordance with this disclosure.
Figure 3B:
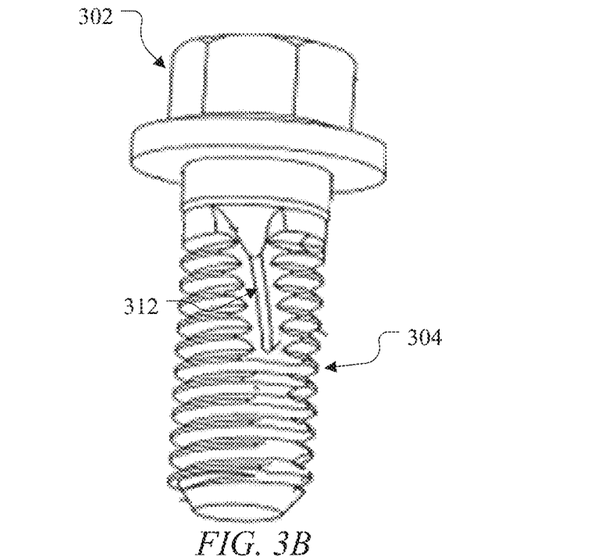

FIGS. 3A and 3B illustrate a second example threaded cooling apparatus 300 with integrated cooling channels and heat exchanger in accordance with this disclosure. As shown in FIG. 3A, the apparatus 300 has been inserted into the manifold of FIGS. 2A and 2B. Here, the apparatus 300 includes a head 302 and a threaded section 304, and the head 302 includes a heat exchanger 314. These components may be the same as or similar to corresponding components described above and could be formed from the same or similar materials and in the same or similar manner.

A cooling channel 310 provides coolant to the heat exchanger 314, and a cooling channel 312 exhausts returned coolant from the heat exchanger 314 (although the coolant flows could be reversed). A seal 316 is located between the head 302 of the apparatus 300 and the manifold or other structure to help prevent coolant from flowing around the apparatus 300 into the ambient environment. The apparatus 300 does not include a flow restrictor (such as flow restrictor 108), which can reduce or eliminate the need for a second seal in the apparatus 300. Instead, the lower threaded area of the threaded section 304 could help to limit coolant flow between the coolant channels 202 and 204 of the manifold. Due to mechanical tolerances, it may be impractical to use both a lower threaded area and an upper threaded area in the threaded section 304. In some circumstances, only the lower area of the threaded section 304 may be threaded, and the upper area of the threaded section 304 may not contain threads.

FIG. 3B illustrates an example way for implementing the cooling channel 312 in the apparatus 300. As shown in FIG. 3B, the cooling channel 312 is formed as a groove in the side of the threaded section 304. The groove splits the thread in the threaded section 304, which still allows the apparatus 300 to be inserted into a threaded receptacle while allowing coolant flow through the groove. Of course, the cooling channel 312 could be implemented in any other suitable manner, such as by not adding threads to the upper area of the threaded section 304.

Figure 4:
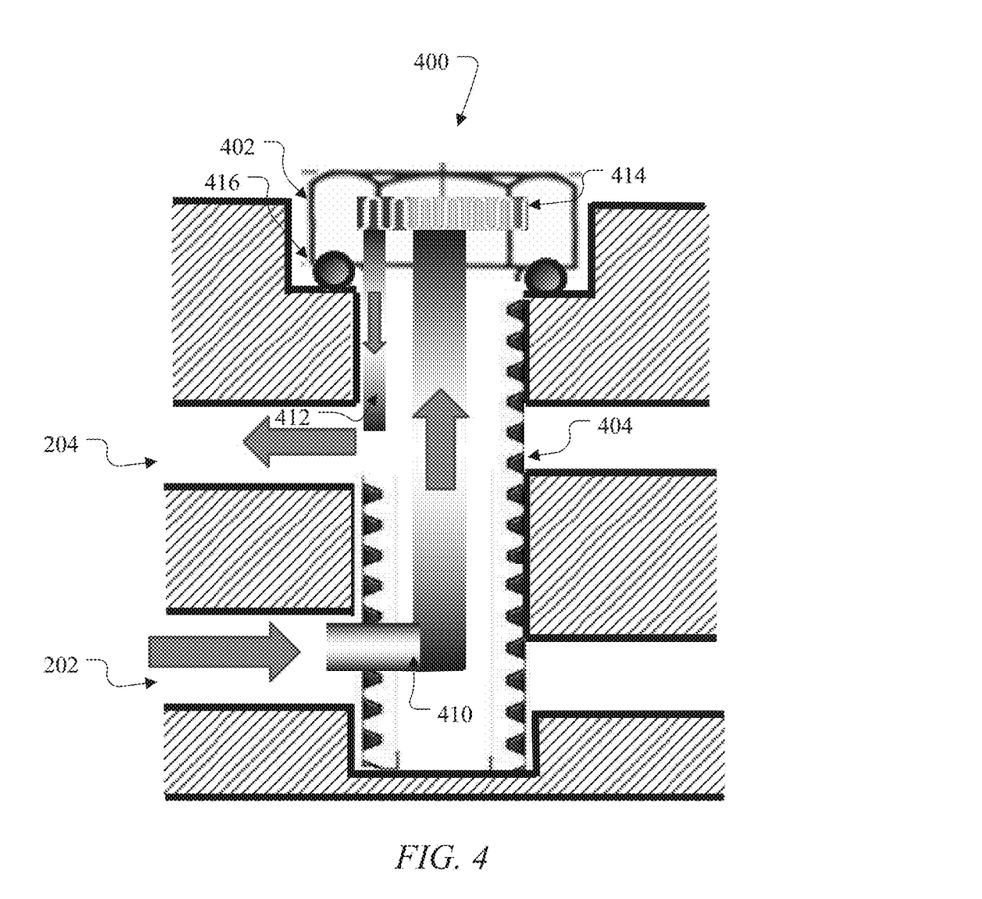
FIG. 4 illustrates a third example threaded cooling apparatus with integrated cooling channels and heat exchanger in accordance with this disclosure.

FIG. 4 illustrates a third example threaded cooling apparatus 400 with integrated cooling channels and heat exchanger in accordance with this disclosure. As shown in FIG. 4, the apparatus 400 has been inserted into the manifold of FIGS. 2A and 2B. Here, the apparatus 400 includes a head 402 and a threaded section 404, and the head 402 includes a heat exchanger 414. Cooling channels 410-412 provide coolant to and exhaust returned coolant from the heat exchanger 414. A seal 416 is located between the head 402 and the manifold or other structure. These components may be the same as or similar to corresponding components described above and could be formed from the same or similar materials and in the same or similar manner. However, in this example, the cooling channel 410 forms an angle and exits the apparatus 400 along the side rather than on bottom. Due to mechanical tolerances, it may be impractical to use a combination of a lower threaded area, a middle threaded area, and an upper threaded area in the threaded section 404. In some circumstances, only the middle area of the threaded section 404 may be threaded, and the upper and lower areas of the threaded section 404 may not contain threads.

Figure 5:
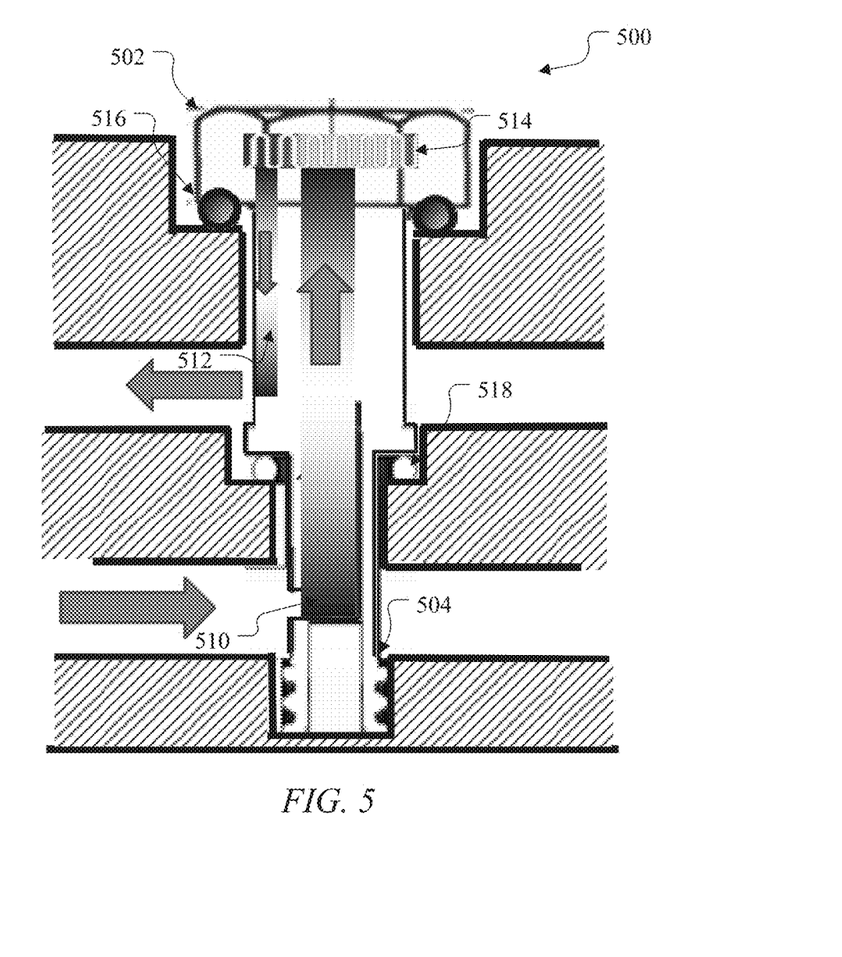
FIG. 5 illustrates a fourth example threaded cooling apparatus with integrated cooling channels and heat exchanger in accordance with this disclosure.

FIG. 5 illustrates a fourth example threaded cooling apparatus 500 with integrated cooling channels and heat exchanger in accordance with this disclosure. As shown in FIG. 5, the apparatus 500 has been inserted into the manifold of FIGS. 2A and 2B. Here, the apparatus 500 includes a head 502 and a threaded section 504, and the head 502 includes a heat exchanger 514. Cooling channels 510-512 provide coolant to and exhaust returned coolant from the heat exchanger 514. A seal 516 is located between the head 502 and the manifold or other structure, and a seal 518 is located between the coolant channels 202-204 of the manifold. The cooling channel 510 forms an angle and exits the apparatus 500 along the side rather than on bottom. In this example, the threaded section 504 contains a helical thread only near the bottom of the apparatus 500.

Figure 6A:
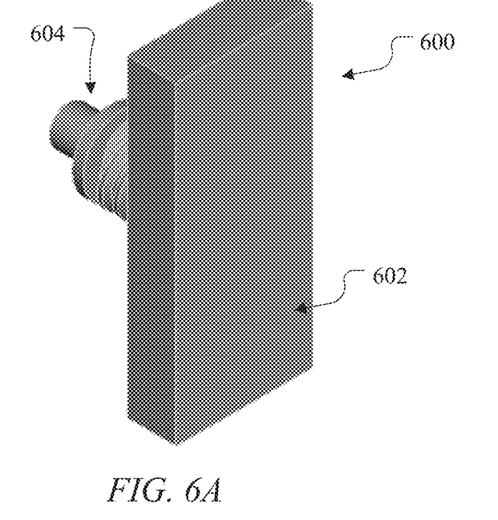
FIGS. 6A through 6C illustrate a fifth example threaded cooling apparatus with integrated cooling channels and heat exchanger in accordance with this disclosure.
Figure 6B:
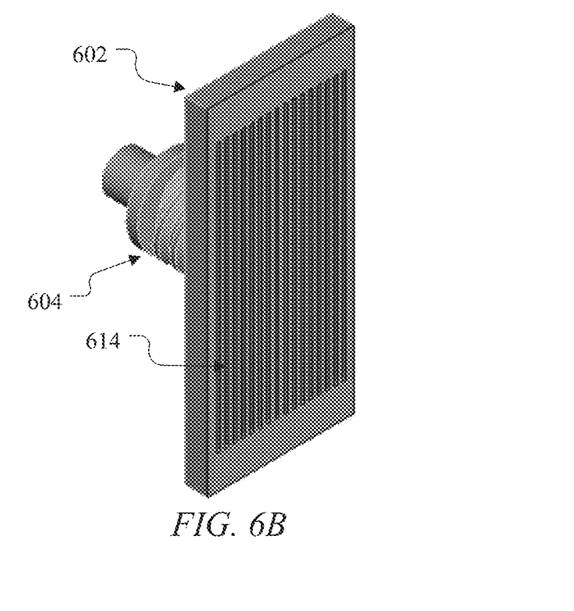
Figure 6C:
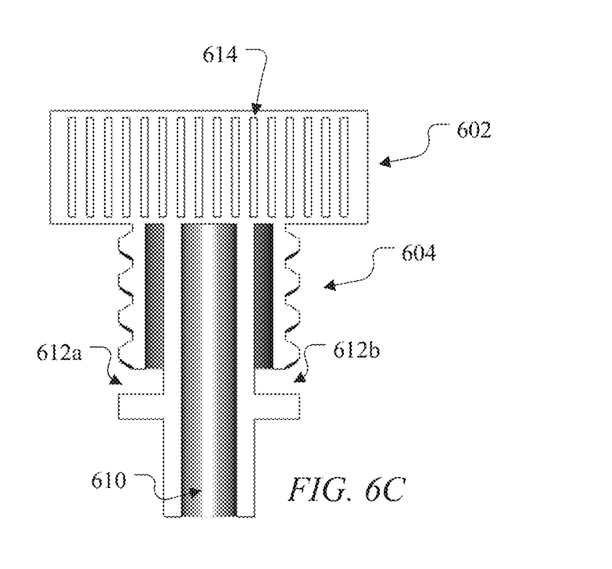

In these figures, the apparatuses 300-500 are shown as having the form of bolts. However, an apparatus having integrated cooling channels and a heat exchanger could be implemented using any other suitable fastener, including non-standard fasteners. FIGS. 6A through 6C illustrate a fifth example threaded cooling apparatus 600 with integrated cooling channels and heat exchanger in accordance with this disclosure. In this example, the apparatus 600 includes a head 602 and a threaded section 604. A cooling channel 610 can be used to deliver coolant to a heat exchanger 614 in the head 602, and one or more cooling channels 612a-612b could exhaust coolant from the heat exchanger 614. FIG. 6B illustrates the apparatus 600 with a top of the head 602 removed to reveal the heat exchanger 614. Various seals are omitted here for simplicity.

In this example, the apparatus 600 represents a non-standard fastener with a rectangular head, although other shapes (including standard hexagonal shapes) could be used. Moreover, the head 602 is much larger than those shown in earlier figures. Among other things, this can enable the use of a larger heat exchanger within the apparatus.

Although FIGS. 3A through 6C illustrate additional examples of threaded cooling apparatuses with integrated cooling channels and heat exchanger, various changes may be made to FIGS. 3A through 6C. For example, any number of cooling channels within an apparatus could be used to supply coolant to a heat exchanger, and any number of cooling channels within an apparatus could be used to exhaust returned coolant from a heat exchanger. Also, note that various features from different figures could be combined as needed or desired. Features shown in one or more of the apparatuses described above could be used in other apparatuses described above.

As can be seen in the figures described above, there are a variety of configurations for plumbing coolant through or across a threaded fastener to a heat exchanger within a head of the threaded fastener. In general, any fastener that includes a heat exchanger integrated into a head of the fastener and multiple cooling channels for coolant flow to and from the heat exchanger falls within the scope of this disclosure. Also, note that any suitable technique can be used to adjust the height of an apparatus over a manifold or other structure into which the apparatus is inserted, including rotation of the apparatus.

Figure 7:
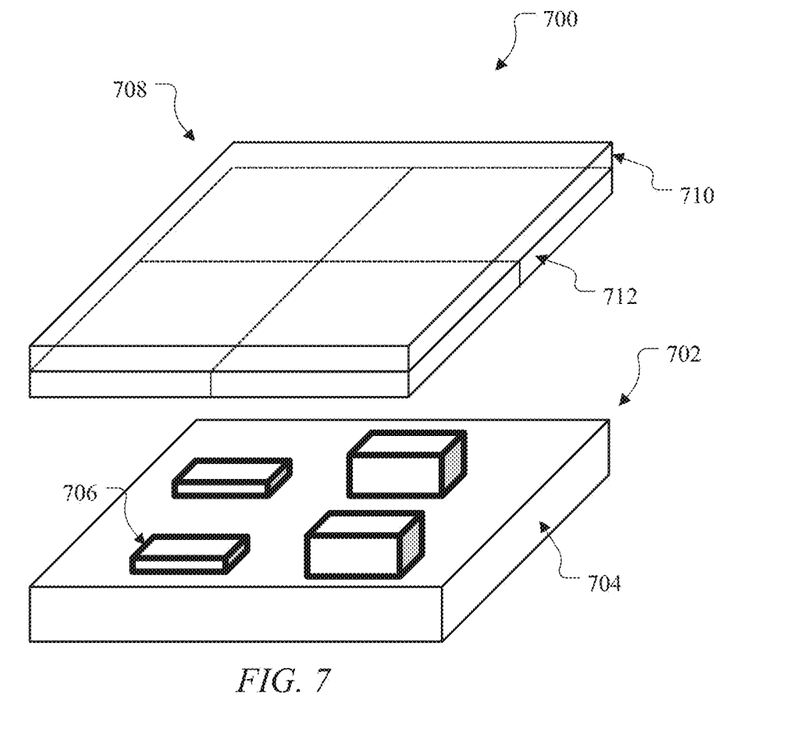
FIG. 7 illustrates an example system having multiple threaded cooling apparatuses with integrated cooling channels and heat exchangers in accordance with this disclosure.

FIG. 7 illustrates an example system 700 having multiple threaded cooling apparatuses with integrated cooling channels and heat exchangers in accordance with this disclosure. As shown in FIG. 7, the system 700 includes an electronic assembly 702 having a substrate 704 and multiple integrated circuit chips 706. The substrate 704 represents any suitable structure configured to carry and support integrated circuit chips, such as a printed circuit board. The integrated circuit chips 706 represent any suitable semiconductor chips, which can be configured to support any desired functionality. In particular embodiments, the electronic assembly 702 could represent a computer motherboard, a ball grid array (BGA), or other structure containing multiple chips. As shown here, different integrated circuit chips 706 can have different lengths, widths, and/or heights (although this need not be the case).

The system 700 also includes a cooling system 708 having a manifold 710 and multiple threaded cooling apparatuses 712. The manifold 710 is configured to deliver coolant to and receive coolant from the threaded cooling apparatuses 712. The threaded cooling apparatuses 712 thermally couple to the integrated circuit chips 706 in the electronic assembly 702 and remove heat away from the integrated circuit chips 706. Each threaded cooling apparatus 712 could include any suitable fastener that includes a heat exchanger integrated into a head of the fastener and multiple cooling channels for coolant flow to and from the heat exchanger (such as any of the devices described above). Each threaded cooling apparatus 712 could be individually adjusted in height in order to contact and effectively remove heat from the associated integrated circuit chip(s) 706.

Although FIG. 7 illustrates one example of a system 700 having multiple threaded cooling apparatuses with integrated cooling channels and heat exchangers, various changes may be made to FIG. 7. For example, the system 700 could include any number of electronic assemblies 702 and cooling systems 708. Also, the electronic assembly 702 could include any number of substrates 704 and integrated circuit chips 706, and the cooling system 708 could include any number of manifolds 710 and threaded cooling apparatuses 712. In addition, while shown as having a one-to-one relationship between the integrated circuit chips 706 and the threaded cooling apparatuses 712, this need not be the case. For instance, a single threaded cooling apparatus 712 could thermally couple to multiple integrated circuit chips 706.

Figure 8:
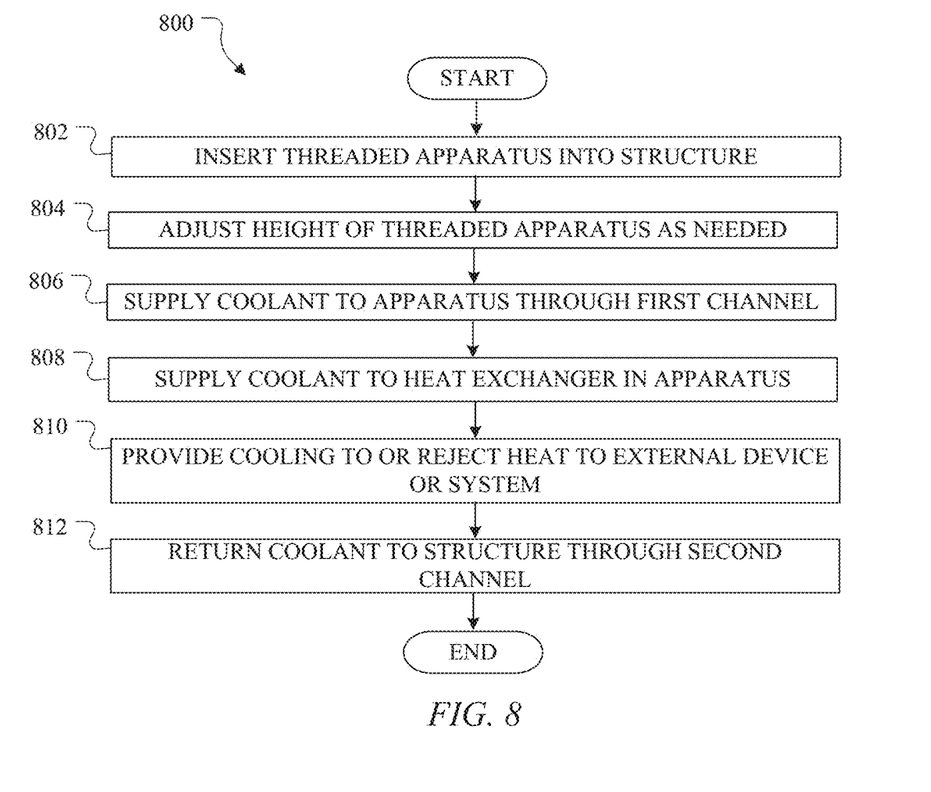
FIG. 8 illustrates an example method for cooling one or more components using a threaded cooling apparatus with integrated cooling channels and heat exchanger in accordance with this disclosure.

FIG. 8 illustrates an example method 800 for cooling one or more components using a threaded cooling apparatus with integrated cooling channels and heat exchanger in accordance with this disclosure. For ease of explanation, the method 800 is described as involving the use of the apparatus 100 connected to the manifold 200. However, the method 800 could involve the use of any other suitable threaded cooling apparatus (such as those described above) in any suitable larger structure.

As shown in FIG. 8, a threaded cooling apparatus is inserted into a structure that provides coolant at step 802. This could include, for example, inserting the apparatus 100 into the manifold 200. The height of the apparatus is adjusted as needed at step 804. This could include, for example, rotating the apparatus 100 or taking other suitable action so that the top surface of the apparatus 100 is at a desired height above the manifold 200. The desired height could be based, for example, on a device or system to be cooled using the apparatus 100, such as the height of one or more semiconductor chips.

Coolant is supplied to the apparatus through a first channel at step 806, and the coolant is supplied to a heat exchanger within the apparatus at step 808. This could include, for example, receiving coolant at the heat exchanger 114 from the manifold 200 through the cooling channel 110. This could also include exchanging heat with the coolant at the heat exchanger 114. In this way, the apparatus helps to provide cooling to or rejects heat to an external device or system at step 810. This could include, for example, transferring heat away from the external device or system into the coolant via the heat exchanger 114. This could alternatively include transferring heat to the external device or system from the coolant via the heat exchanger 114. The coolant is returned to the structure at step 812. This could include, for example, exhausting returned coolant to the manifold 200 through the cooling channel(s) 112a-112b.

Although FIG. 8 illustrates one example of a method 800 for cooling one or more components using a threaded cooling apparatus with integrated cooling channels and heat exchanger, various changes may be made to FIG. 8. For example, the method 800 could involve the use of multiple threaded apparatuses, such as multiple apparatuses inserted into a coldplate, and those multiple threaded apparatuses may or may not be identical. Also, while shown as a series of steps, various steps in FIG. 8 could overlap, occur in parallel, or occur multiple times.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A threaded cooling apparatus comprising:
  a head comprising a heat exchanger; and
  a shaft comprising a threaded section having threads disposed on an exterior surface of the shaft, the threaded section configured to mechanically fasten the head directly to a structure;
  wherein the heat exchanger is configured to exchange heat with a coolant flowing through the head;
  wherein the shaft further comprises first and second cooling channels extending through at least a portion of the threaded section of the shaft, the first cooling channel configured to receive the coolant from a coolant channel of the structure and deliver the coolant to the heat exchanger, the second cooling channel configured to exhaust the coolant from the heat exchanger into the structure;
  wherein an entry of the first cooling channel and an exit of the second cooling channel are located along a side of the shaft; and
  wherein at least one of the entry of the first cooling channel and the exit of the second cooling channel forms an opening within the threads of the threaded section of the shaft.

2. The threaded cooling apparatus of claim 1, wherein a first portion of the first cooling channel coupled to the entry of the first cooling channel and a second portion of the first cooling channel extending to the heat exchanger form an angle within the shaft.

3. The threaded cooling apparatus of claim 2, wherein a portion of the second cooling channel and the second portion of the first cooling channel are parallel within the shaft.

4. The threaded cooling apparatus of claim 1, wherein the heat exchanger is configured to translate perpendicular to a surface of the structure based on rotation of the threaded cooling apparatus.

5. The threaded cooling apparatus of claim 1, further comprising:
  a first seal between the head and the structure, the first seal configured to reduce or prevent coolant loss.

6. The threaded cooling apparatus of claim 5, further comprising:
  a second seal configured to reduce or prevent coolant flow between the first and second cooling channels that bypasses the heat exchanger.

7. The threaded cooling apparatus of claim 1, wherein the head and the shaft form a bolt.

8. The threaded cooling apparatus of claim 1, wherein the second cooling channel comprises a groove through at least part of the shaft.

9. The threaded cooling apparatus of claim 1, wherein the first cooling channel of the shaft is separate from the coolant channel of the structure.

10. The threaded cooling apparatus of claim 1, wherein the head is disposed at a first end of the threaded cooling apparatus, the head having external surfaces configured to contact corresponding surfaces of a rotation tool that is configured to apply force to the head in order to rotate the threaded cooling apparatus.

11. The threaded cooling apparatus of claim 1, wherein:
  the shaft comprises a lower portion, a middle portion, and an upper portion;
  the threaded section includes at least the middle portion; and
  at least one of the upper and lower portions is not threaded.

12. A system comprising:
  a threaded cooling apparatus comprising:
    a head comprising a heat exchanger; and
    a shaft comprising a threaded section having threads disposed on an exterior surface of the shaft;
    wherein the heat exchanger is configured to exchange heat with a coolant flowing through the head;
    wherein the shaft further comprises first and second cooling channels extending through at least a portion of the threaded section of the shaft, the first cooling channel configured to receive the coolant and deliver the coolant to the heat exchanger, the second cooling channel configured to exhaust the coolant from the heat exchanger;
    wherein an entry of the first cooling channel and an exit of the second cooling channel are located along a side of the shaft; and
    wherein at least one of the entry of the first cooling channel and the exit of the second cooling channel forms an opening within the threads of the threaded section of the shaft; and
  a manifold comprising first and second coolant channels, the first coolant channel configured to provide the coolant directly to the first cooling channel of the threaded cooling apparatus, the second coolant channel configured to return the coolant from the second cooling channel of the threaded cooling apparatus;
  wherein the threaded section is configured to mechanically fasten the head directly to the manifold.

13. The system of claim 12, wherein a first portion of the first cooling channel coupled to the entry of the first cooling channel and a second portion of the first cooling channel extending to the heat exchanger form an angle within the shaft.

14. The system of claim 13, wherein a portion of the second cooling channel and the second portion of the first cooling channel are parallel within the shaft.

15. The system of claim 12, wherein the heat exchanger is configured to translate perpendicular to a surface of the manifold based on rotation of the threaded cooling apparatus.

16. The system of claim 12, wherein the threaded cooling apparatus further comprises a first seal between the head and the manifold, the first seal configured to reduce or prevent coolant loss.

17. The system of claim 16, wherein the threaded cooling apparatus further comprises a second seal configured to reduce or prevent coolant flow between the first and second cooling channels that bypasses the heat exchanger.

18. The system of claim 12, wherein the head and the shaft of the threaded cooling apparatus form a bolt.

19. The system of claim 12, wherein the second cooling channel comprises a groove through at least part of the shaft.

20. A method comprising:
- inserting a threaded cooling apparatus into a structure, the threaded cooling apparatus comprising a head and a shaft, the head comprising a heat exchanger, the shaft comprising a threaded section having threads disposed on an exterior surface of the shaft, the threaded section configured to mechanically fasten the head directly to the structure;
- receiving, at a first cooling channel in the shaft, coolant from a coolant channel of the structure;
- providing the coolant to the heat exchanger through the first cooling channel in the shaft, the heat exchanger configured to exchange heat with the coolant flowing through the head; and
- exhausting the coolant from the heat exchanger into the structure through a second cooling channel in the shaft, the first and second cooling channels extending through at least a portion of the threaded section of the shaft;
- wherein an entry of the first cooling channel and an exit of the second cooling channel are located along a side of the shaft; and
- wherein at least one of the entry of the first cooling channel and the exit of the second cooling channel forms an opening within the threads of the threaded section of the shaft.

* * * * *